(12) United States Patent
Kim

(10) Patent No.: US 11,832,387 B2
(45) Date of Patent: Nov. 28, 2023

(54) PRINTED CIRCUIT BOARD AND VEHICLE INCLUDING THE SAME

(71) Applicant: HYUNDAI MOBIS CO., LTD., Seoul (KR)

(72) Inventor: Myeong Je Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 14 days.

(21) Appl. No.: 17/854,746

(22) Filed: Jun. 30, 2022

(65) Prior Publication Data

US 2023/0073345 A1    Mar. 9, 2023

(30) Foreign Application Priority Data

Aug. 24, 2021   (KR) .................. 10-2021-0111701

(51) Int. Cl.
*H05K 1/11*     (2006.01)
*H05K 1/02*     (2006.01)

(52) U.S. Cl.
CPC .......... *H05K 1/113* (2013.01); *H05K 1/0209* (2013.01); *H05K 2201/0215* (2013.01); *H05K 2201/0959* (2013.01); *H05K 2201/09481* (2013.01); *H05K 2201/10106* (2013.01)

(58) Field of Classification Search
CPC .................. H05K 1/112–116; H05K 1/18–189
See application file for complete search history.

(56) References Cited

U.S. PATENT DOCUMENTS 9,716,061 B2 *   7/2017   Palaniswamy .... H01L 23/49872
9,837,592 B2 *  12/2017   Ho .......................... H01L 24/73

* cited by examiner

*Primary Examiner* — Jeremy C Norris
(74) *Attorney, Agent, or Firm* — NovoTechIP International PLLC

(57) ABSTRACT

A printed circuit board, on which at least one light emitting diode including at least two electrodes is mounted, includes a base member, an insulating layer disposed on the base member, a plurality of conductive pads disposed on the insulating layer and electrically connected to the light emitting diode, a plurality of via holes formed through at least one conductive pad of the plurality of conductive pads and at least a portion of each insulating layer, and filling members disposed in the plurality of via holes to electrically connect the base member to the at least one conductive pad, A distance between the plurality of via holes is 'n' times greater than a depth of at least one via hole of the plurality of via holes, in which 'n' is a positive integer greater than '1' and less than '10'.

18 Claims, 12 Drawing Sheets

PRINTED CIRCUIT BOARD AND VEHICLE INCLUDING THE SAME

CROSS-REFERENCE TO RELATED APPLICATIONS

This application claims the benefit of priority to Korean Patent Application No. 10-2021-0111701, filed in the Korean Intellectual Property Office on Aug. 24, 2021, the entire content of which is incorporated herein by reference.

BACKGROUND

1. Technical Field

The present disclosure relates to a printed circuit board (PCB) and a vehicle including the same.

2. Discussion of Related Art

In general, a light emitting diode (LED), which is a next-generation light source device which converts electricity into light using the characteristics of a compound semiconductor, has been extensively used and developed in various fields, such as electrical and electronic products, industrial machinery, and vehicles.

Such a light emitting diode may generate a large amount of heat, as light is emitted. The intrinsic function of the light emitting diode may be degraded due to the heat generated from the light emitting diode, and may cause malfunction and degradation of devices provided at a peripheral portion of the light emitting diode. Accordingly, there is a need for a heat dissipation member capable of effectively dissipating the heat emitted from the light emitting diode to the outside.

SUMMARY

To dissipate heat, which is emitted from a light emitting diode (LED), to the outside, the light emitting diode may be mounted on a printed circuit board (PCB) including a higher heat dissipation sheet. However, costs may be increased due to higher-price heat dissipation sheet.

The present disclosure has been made to solve the above-mentioned problems occurring in the prior art while advantages achieved by the prior art are maintained intact.

An aspect of the present disclosure provides a printed circuit board, capable of ensuring the competition in cost by reducing the material costs, and a vehicle including the same.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a printed circuit board (PCB), on which one or more light emitting diodes (LEDs) are mounted, each LED including a plurality of electrodes, the PCB may include a base member, an insulating layer disposed on the base member, a plurality of conductive pads disposed on the insulating layer and electrically connected to the LED, a plurality of via holes, each extending through one of the plurality of conductive pads and into the insulating layer, and a plurality of filling members respectively disposed at the plurality of via holes and configured to electrically connect the base member to the plurality of conductive pads, A distance between two of the plurality of via holes may be neighboring each other n times greater than a depth of at least one of the plurality of via holes, wherein n is a positive integer greater than 1 and less than 10.

According to an embodiment, the distance between the plurality of via holes may be twice or triple times greater than the depth of the at least one via hole.

According to an embodiment, the LED may include an anode electrode and a cathode electrode, and the plurality of conductive pads may include (1) an anode pad electrically connected to the anode electrode of the LED, and (2) a cathode pad electrically connected to the cathode electrode of the LED.

According to an embodiment, the plurality of via holes may extend through the cathode pad.

According to an embodiment, the cathode pad is connected to receive a ground signal.

According to an embodiment, the printed circuit board may further include a power terminal electrically connected to the anode pad, a plurality of coupling holes disposed at the base member, and a coupling member extending into the coupling holes and configured to couple the PCB to an under-base structure disposed under the base member. A head of the coupling member may be spaced apart from the power terminal.

According to an embodiment, the LED further may include a heat dissipation electrode spaced apart from the anode electrode and the cathode electrode, and the plurality of conductive pads may further include a heat dissipation pad electrically connected to the heat dissipation electrode.

According to an embodiment, the plurality of via holes may extend through the heat dissipation pad.

According to an embodiment, the base member and the filling member may comprise metal of the same series.

According to an embodiment, the base member may comprise copper, and the filling member may be plated with copper.

According to an embodiment, the insulating layer may be interposed between the base member and the plurality of conductive pads, and the insulating layer may have a thickness smaller than that of the base member.

According to another aspect of the present disclosure, a vehicle may include the one or more LEDs.

BRIEF DESCRIPTION OF THE DRAWINGS

The above and other objects, features and advantages of the present disclosure will be more apparent from the following detailed description taken in conjunction with the accompanying drawings.

Regarding the description of drawings, the same reference numerals or like reference numerals will be assigned to the same components or light components.

DETAILED DESCRIPTION

Hereinafter, various embodiments of the present disclosure may be described with reference to accompanying drawings. However, those of ordinary skill in the art will understand that the present disclosure is not limited to a specific embodiment, and modifications, equivalents, and/or alternatives on the various embodiments described herein can be variously made without departing from the scope and spirit of the present disclosure.

Figure 1:
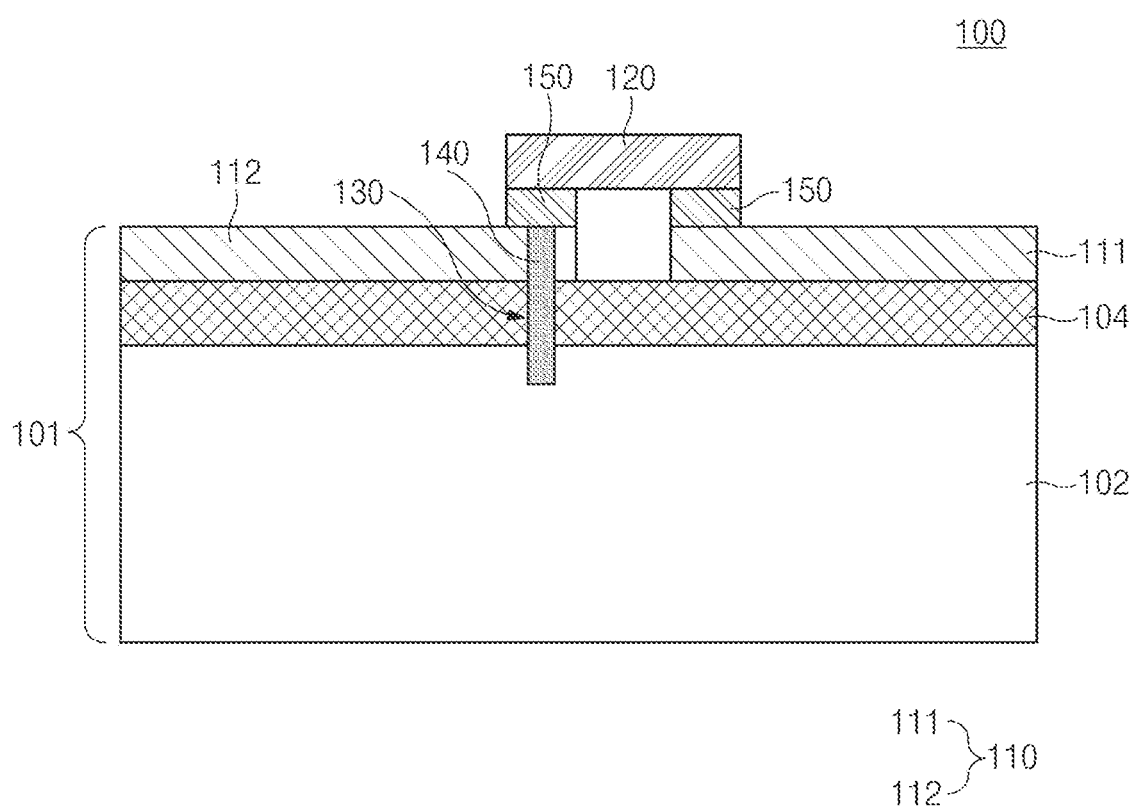
FIG. 1 is a cross-sectional view illustrating a light source module, according to various embodiment.

FIG. 1 is a cross-sectional view illustrating a light source module, according to various embodiments.

Referring to FIG. 1, a light source module 100 according to various embodiments may include a printed circuit board (PCB) 101 and at least one light emitting diode (LED) 120.

The printed circuit board 101 may be a metal core printed circuit board (MCPCB) which employs metal having excellent thermal conductivity as a base member 102. The printed circuit board 101 may include the base member 102, an insulating layer 104, and a plurality of conductive pad members 110.

The base member 102 may be formed of a thermally conductive metal. For example, the base member 102 may be formed of copper, aluminum, steel, or the alloy thereof. The base member 102 may be formed to have a thickness thicker than that of the insulating layer 104.

The insulating layer 104 may be formed on the base member 102. The insulating layer 104 may be formed of an insulating material having thermal conductivity. For example, the insulating layer 104 may be a thermosetting or thermoplastic polymer substrate, a ceramic substrate, an organic-inorganic composite material substrate, or an impregnated glass fiber impregnated substrate. For example, when the insulating layer 104 includes a polymer resin, the insulating layer 104 may include an epoxy-based insulating resin or a polyimide-based resin, such as FR-4, bismaleimide triazine (BT), or an Ajinomoto build-up film (ABF)

A plurality of pad members 110 may be disposed on the insulating layer 104 to form an electrical circuit pattern. The plurality of pad members 110 may be formed of a conductive material. The plurality of pad members 110 may be disposed to be spaced apart from each other. The plurality of pad members 110 may include at least two conductive pads 111 and 112 to apply mutually different driving signals.

For example, when the light emitting diode 120 having two electrodes is mounted on the printed circuit board 101, the plurality of pad members 110 may include a first conductive pad 111 and a second conductive pad 112. Any one of the first conductive pad 111 and the second conductive pad 112 may be electrically connected to the anode electrode of the light emitting diode 120 through a solder member 150. Another of the first conductive pad 111 and the second conductive pad 112 may be electrically connected to a cathode of the light emitting diode 120 through the solder member 150.

For another example, when the light emitting diode 120 having three electrodes is mounted on the printed circuit board 101, the plurality of pad members 110 may include first to third conductive pads. Any one of the first to third conductive pads may be electrically connected to the anode electrode of the light emitting diode 120. Any one of two conductive pads of the first to third conductive pads may be electrically connected to the cathode electrode of the light emitting diode 120 through the solder member 150. Another of the two conductive pads of the first to third conductive pads may be electrically connected to a heat dissipation electrode of the light emitting diode 120 through the solder member 150.

A plurality of via hole 130 may be formed to be overlapped with the light emitting diode 120. Since the via hole 130 may dissipate heat emitted from the light emitting diode 120 to the base member 102, the via hole 130 may increase the heat dissipation effect. As the number of via holes 130 is increased, the number of heat dissipation paths may be increased. Accordingly, the thermal resistance may be decreased and the heat dissipation effect may be increased.

The via hole 130 may extend through at least one of conductive pads electrically connected to at least one of the cathode electrode of the light emitting diode 120 or the heat dissipation electrode, or any combination thereof. According to an embodiment of the present disclosure, the via hole 130 may extend through at least one of the plurality of conductive pad members 110 and the insulating layer 104 to expose a top surface of the base member 102. According to another embodiment of the present disclosure, the via hole 130 may extend through at least one of the plurality of conductive pad members 110 and the insulating layer 104 and may extend through a portion of the base member 102. The via hole 130 may expose a partial surface inside the base member 102.

According to an embodiment of the present disclosure, the via hole 130 may be formed as an empty space having a specific depth. According to another embodiment, a filling member 140 may be filled in the via hole 130. The solder member 150 may be disposed on the filling member 140.

Figure 2:
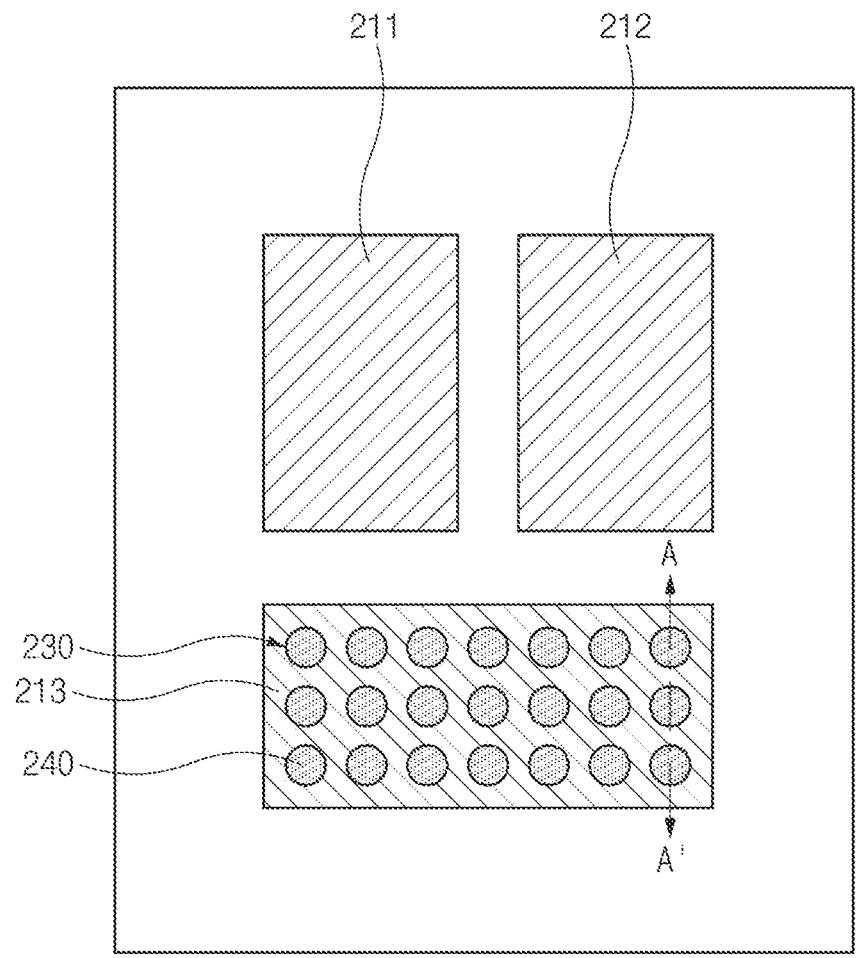
FIG. 2 is a plan view illustrating a printed circuit board (PCB) including a heat dissipation pad, according to the present disclosure.
Figure 3:
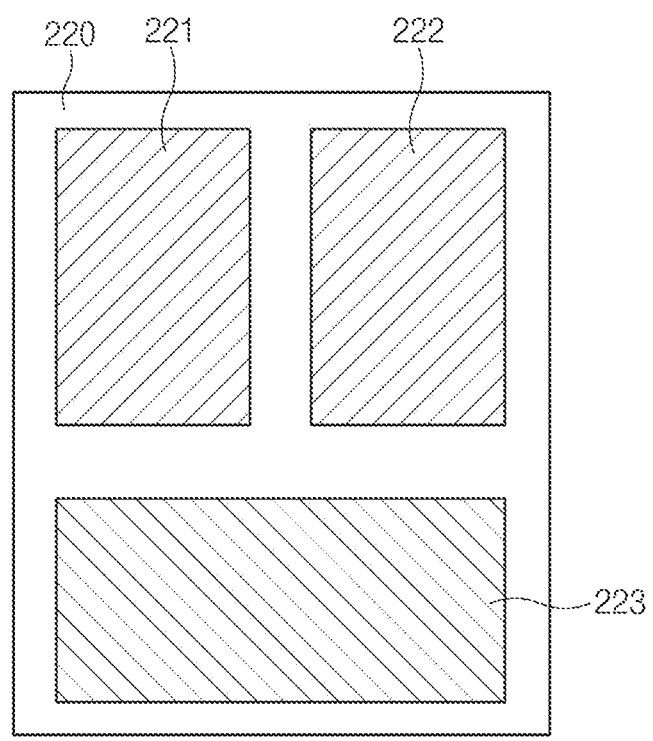
FIG. 3 is a plan view illustrating a light emitting diode (LED) mounted on the printed circuit board illustrated in FIG. 2.
Figure 4:
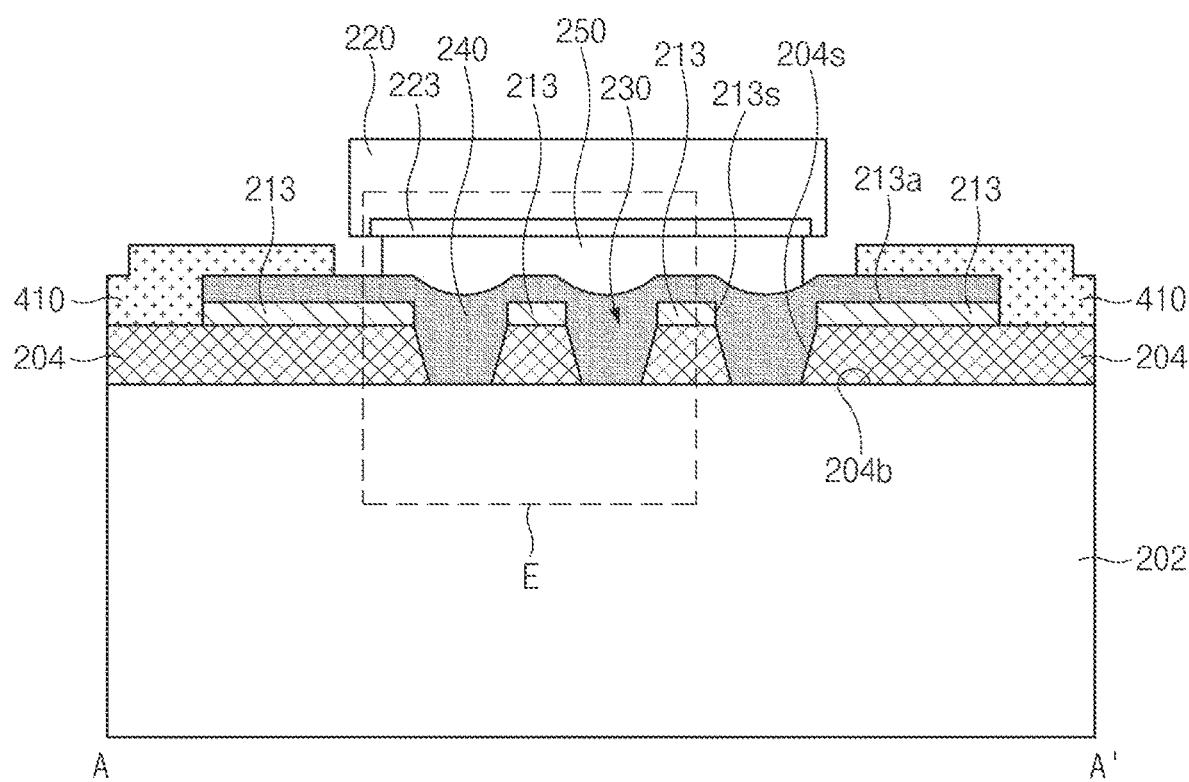
FIG. 4 is a cross-sectional view taken along line "A-A" in FIG. 2 and illustrating the printed circuit board and the light emitting diode mounted on the printed circuit board.

FIG. 2 is a plan view illustrating a printed circuit board including a heat dissipation pad according to the present disclosure, FIG. 3 is a plan view illustrating a light emitting diode mounted on the printed circuit board illustrated in FIG. 2, and FIG. 4 is a cross-sectional view taken along line "A-A" in FIG. 2 and illustrating the printed circuit board and the light emitting diode mounted on the printed circuit board.

Referring to FIGS. 2 to 4, a printed circuit board 201 may include a base member 202, an insulating layer 204, a plurality of pad members 210, a filling member 240, and a protective member 410.

A light emitting diode 220 having an anode electrode 221, a cathode electrode 222, and a heat dissipation electrode 223 may be mounted on the printed circuit board 201. The plurality of pad members 210 on the printed circuit board 201 may include an anode pad 211, a cathode pad 212, and a heat dissipation pad 213.

The anode pad 211 may be electrically connected to the anode electrode 221 to supply a driving signal (positive polarity driving signal) having a positive polarity to the anode electrode 221. The cathode pad 212 is electrically connected to the cathode electrode 222 to supply a driving signal (negative polarity driving signal) having a negative polarity or a ground GND signal, to the cathode electrode 222. For example, the positive polarity driving signal may be a signal having a higher level than a level of a reference signal which is set, and the negative polarity driving signal may be a signal having a lower level than that of the set reference signal. The heat dissipation pad 213 may be electrically connected to the heat dissipation electrode 223. For example, the heat dissipation pad 213 and the heat dissipation electrode 223 may be in a floating state, or the ground signal 'GND' may be supplied to the heat dissipation pad 213 and the heat dissipation electrode 223.

At least one of the anode pad 211, the cathode pad 212, or the heat dissipation pad 213, or any combination thereof, may be formed to include at least one via hole 230. For example, heat dissipation pad 213 may be formed to include a plurality of via holes 230. The anode pad 211 and the cathode pad 212 may be formed to have a flat top surface having no via hole.

The plurality of via holes 230 may extend through a partial region of each of the insulating layer 204 and the heat dissipation pad 213. The plurality of via holes 230 may expose a side surface 204s and a lower surface 204b of the insulating layer 204, and may also expose a side surface 213s and a top surface 213a of the heat dissipation pad 213. The plurality of via holes 230 may expose a partial region of the base member 202.

The filling member 240 may be filled in a plurality of via holes 230. The filling member 240 may be formed on the side surface 204s and the bottom surface 204b of the insulating layer 204 exposed through the plurality of via holes 230, and may be formed on the side surface 213s and the upper surface 213a of the heat dissipation pad 213. The filling member 240 may fill the plurality of via holes 230 by plating copper. Accordingly, since the solder member 250 may be prevented from being introduced into the via hole 230, contact failure between the heat dissipation pad 213 and the heat dissipation electrode 223 through the solder member 250 may be prevented.

The filling member 240 may make contact with the base member 202 exposed through the plurality of via holes 230. The heat generated from the light emitting diode 220 may be transferred to the base member 202 through the heat dissipation electrode 223, the heat dissipation pad 213, and the filling member 240. Accordingly, heat dissipation efficiency of the light emitting diode 220 may be improved.

The filling member 240 may include metal in the same series as that of the base member 202 formed of a conductive material to dissipate heat generated from the light emitting diode 220. For example, when the filling member 240 includes copper, or is plated with copper, the base member 202 may include a copper (Cu)-based metal. Accordingly, the base member 202 may be prevented from being corroded by the filling solution, which is a material of the filling member 240. Meanwhile, when the base member 202 is formed of a metal (e.g., Al) of a different series from the filling solution (e.g., Cu) of the filling member 240, the base member 202 may be corroded by a liquid component included in the filling solution.

The protective member 410 may be formed to expose at least a portion of the plurality of pad members 210 which are in electrical contact with the light emitting diode 220. The protective member 410 may be formed to be non-overlapping with at least a portion of each of the anode pad 211, the cathode pad 212, and the heat dissipation pad 213. The protective member 410 may be formed on the insulating layer 204 to be overlapped with the remaining regions except for at least a portion of each of the anode pad 211, the cathode pad 212, and the heat dissipation pad 213. The protective member 410 may be formed in at least one layer using any one or more of a solder resist, an oxide, and gold (Au).

Figure 5:
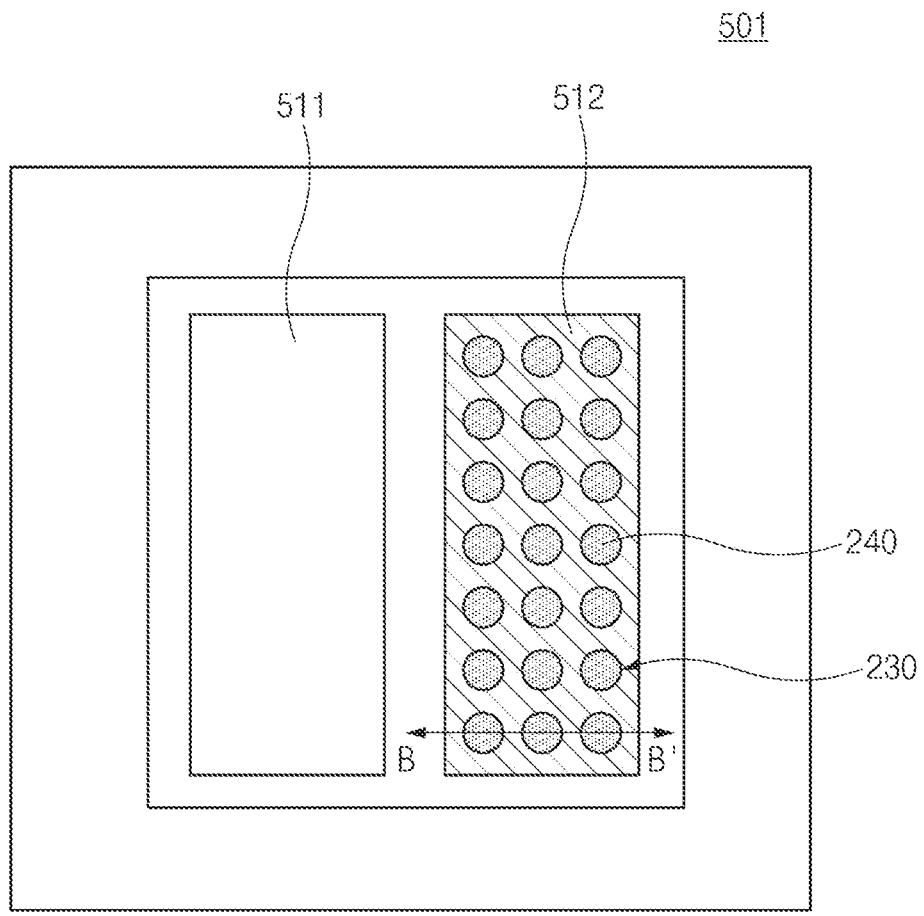
FIG. 5 is a plan view illustrating a printed circuit board having no heat dissipation pad, according to the present disclosure.
Figure 6:
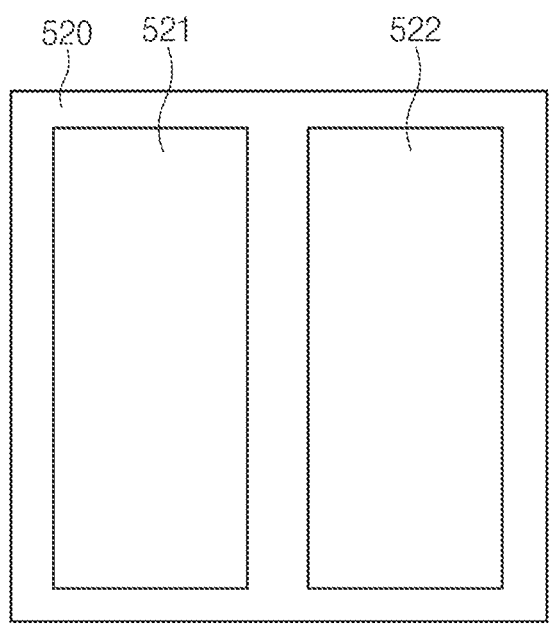
FIG. 6 is a plan view illustrating a bottom surface of a light emitting diode mounted on the printed circuit board illustrated in FIG. 2.
Figure 7:
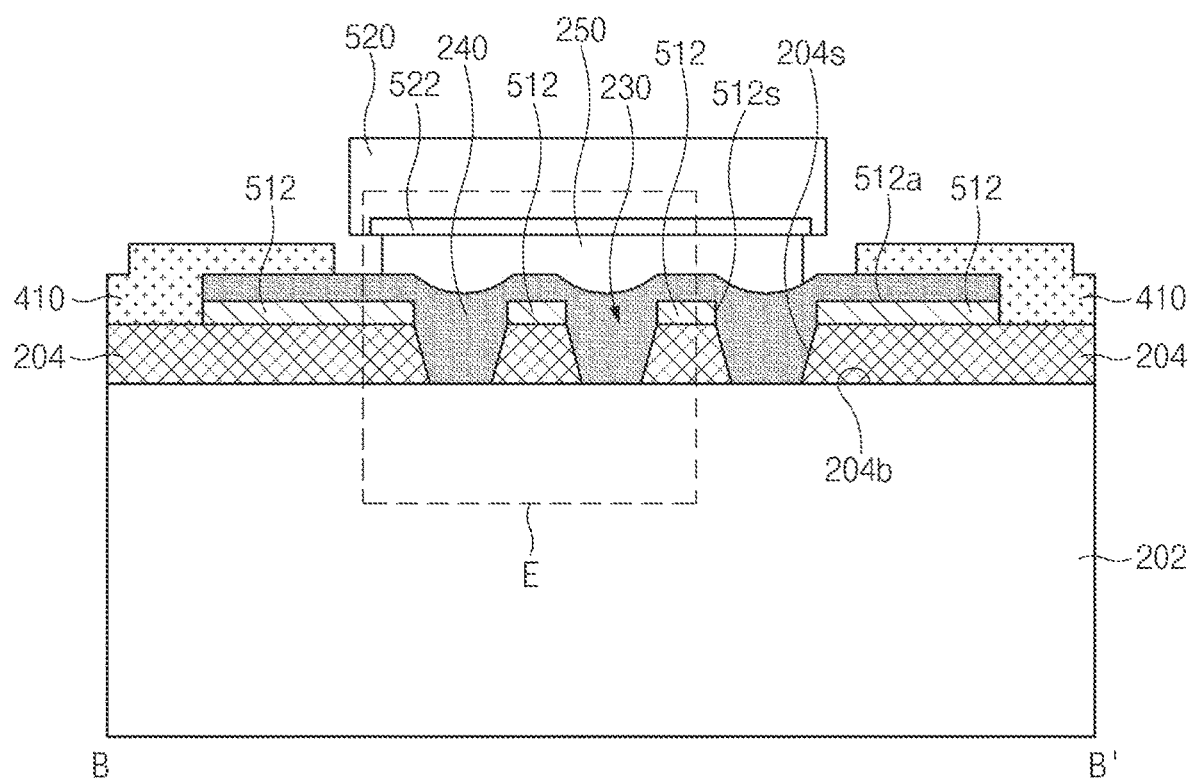
FIG. 7 is a cross-sectional view taken along line "B-B" in FIG. 5 and illustrating a printed circuit board and a light emitting diode on the printed circuit board.

FIG. 5 is a plan view illustrating a printed circuit board having no heat dissipation pad according to the present disclosure, FIG. 6 is a plan view illustrating a bottom surface of a light emitting diode mounted on the printed circuit board illustrated in FIG. 2, and FIG. 7 is a cross-sectional view taken along line "B-B" in FIG. 5 and illustrating a printed circuit board and a light emitting diode on the printed circuit board.

Referring to FIGS. 5 to 7, the printed circuit board 501 may include the base member 202, the insulating layer 204, a plurality of pad members 510, the filling member 240, and the protective member 410. A light emitting diode 520 having an anode electrode 521 and a cathode electrode 522 may be mounted on the printed circuit board 501. A plurality of pad members 510 of the printed circuit board 501 may include an anode pad 511 electrically connected to an anode electrode 521 and a cathode pad 512 which serves as a heat dissipation pad and make contact with a cathode electrode 522. A driving signal may be applied to the anode electrode 521 through the anode pad 511. The ground GND signal having a lower voltage level than the driving signal may be supplied to the cathode electrode 522 through the cathode pad 512.

The cathode pad 512 may be formed to include the plurality of via holes 230. The anode pad 511 may be formed to have a flat top surface having no via hole.

The filling member 240 may be filled in the plurality of via holes 230. The filling member 240 may be filled in the plurality of via holes 230 through a copper plating process. Accordingly, since the solder member 250 may be prevented from being introduced into the via hole 230, contact failure between the cathode pad 512 and the cathode electrode 522 through the solder member 250 may be prevented.

The filling member 240 may make contact with the exposed base member 202 through the plurality of via holes 230. Heat emitted from the light emitting diode 520 may be transferred to the base member 202 through the cathode electrode 522, the cathode pad 512, and the filling member 240. Accordingly, heat dissipation efficiency of the light emitting diode 520 may be improved.

The filling member 240 may be formed of a metal of the same series as the base member 202 formed of a conductive material to emit heat generated from the light emitting diode 520. Accordingly, the base member 202 may be prevented from being corroded by the filling solution, which is a material of the filling member 240.

The protective member 410 may be formed not to be overlapped with at least a portion of each of the anode pad 511 and the cathode pad 512. The protective member 410 may be formed on the insulating layer 204 to be overlapped with the remaining regions, except for at least a portion of each of the anode pad 511 and the cathode pad 512. The protective member 410 may be formed in at least one layer using any one or more of a solder resist, an oxide, and gold (Au).

Figure 8:
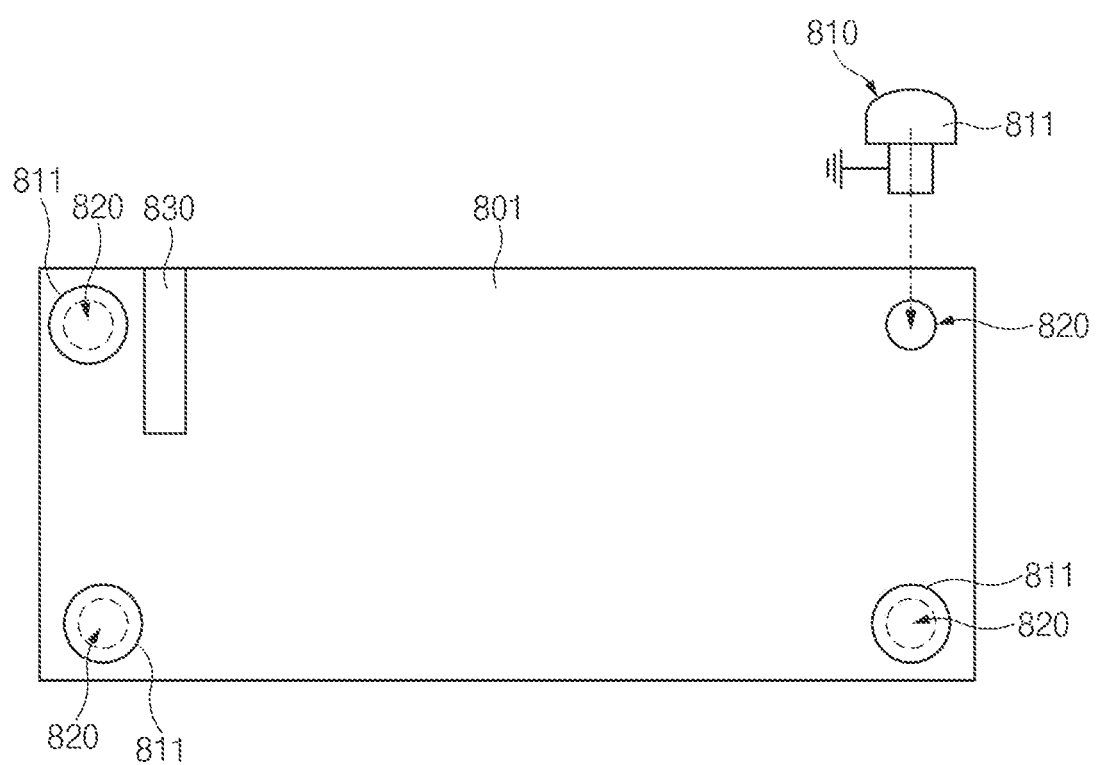
FIG. 8 is a view illustrating a printed circuit board including a coupling member, according to various embodiments.

FIG. 8 is a view illustrating a printed circuit board including a coupling member according to various embodiments.

Referring to FIG. 8, a printed circuit board 801 (e.g., the printed circuit board 201 of FIG. 2 or the printed circuit board 501 of FIG. 5) according to various embodiments may include a plurality of coupling hole 820. The plurality of coupling hole 820 may extend through a base member (e.g., the base member 202 of FIGS. 4 and 7), or may extend through at least one of an insulating layer (e.g., the insulating layer 204 of FIGS. 4 and 7) or a protective layer (e.g., the protective layer 410 of FIGS. 4 and 7), or any combination thereof, and the base member.

The printed circuit board 801 may be coupled to an under-base structure disposed under the base member through a coupling member 810 inserted into the coupling hole 820. The under-base structure may be a structure including a heat sink and/or a sus material.

The ground signal may be applied to the coupling member 810 through a structure including the heat sink and the sus material. The coupling member 810 may be spaced apart from a conductive structure to which an electrical signal different from the ground signal applied to the coupling member 810 is applied. For example, an outer surface of a head 811 of the coupling member 810 may be spaced apart from at least one of an anode pad or a power terminal 830 electrically connected to the anode pad, or any combination thereof.

Figure 9:
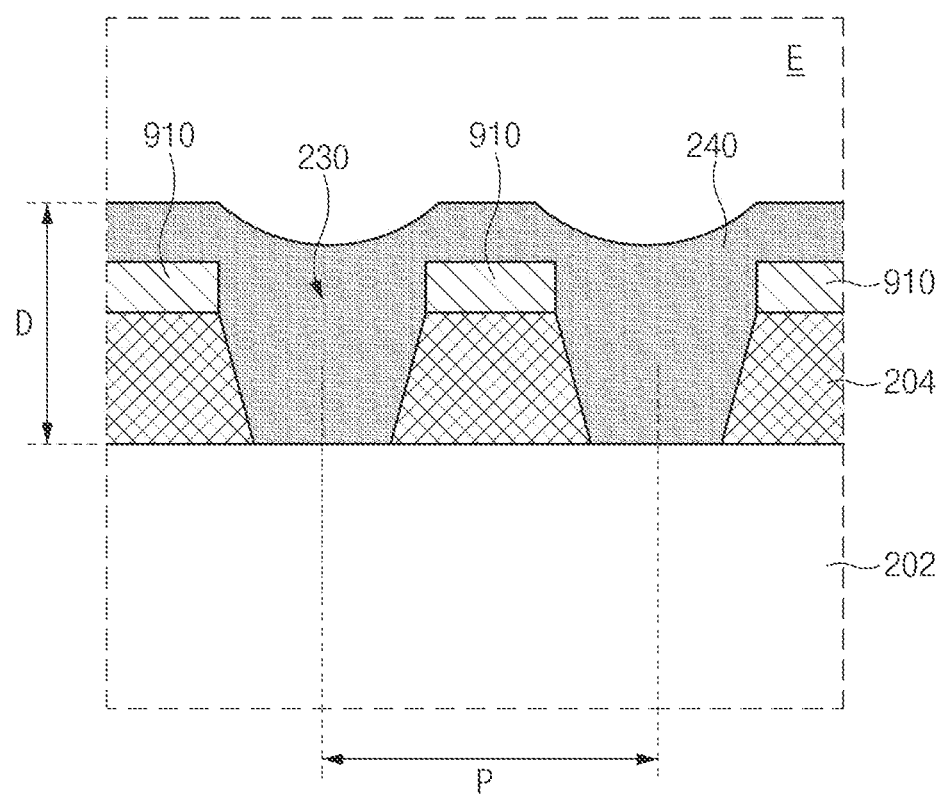
FIG. 9 is a view illustrating the relationships between a distance and a depth of via holes in a printed circuit board, according to various embodiments.

FIG. 9 is a view illustrating the distance and the depth relationship between via holes in a printed circuit board according to various embodiments, and is an enlarged view of a region 'E' of the printed circuit board in FIGS. 4 and 7.

Referring to FIG. 9, the plurality of via holes 230 according to various embodiments may extend through a conductive pad 910 (e.g., the heat dissipation pad 213 of FIG. 4 or the cathode pad 512 of FIG. 7) and the insulating layer 204. A portion of the base member 202 may be exposed through the plurality of via holes 230. The filling member 240 may be filled in each of the plurality of via holes 230.

In order for the filling member 240 to be completely filled in the via hole 230, a distance 'P' between the via holes 230 may be formed to be greater than the depth 'D' of the via hole 230. The distance 'P' between the via holes 230 may be a distance from the center of any one via hole 230 of the plurality of via holes 230 to the center of an adjacent via hole 230 of the plurality of via holes 230. The depth 'D' of the via hole 230 may be the sum of the thickness of the insulating layer 204 and the thickness of the conductive pad 910. According to an embodiment of the present disclosure, the distance 'P' between the via hole 230 may be formed to be n times greater than the depth 'D' of the via hole 230 (in this case, 'n' is a positive integer greater than '1' and less than '10'). For example, the distance 'P' between the via holes 230 may be twice or triple times greater than the depth 'D' of the via hole 230.

Figure 10A:
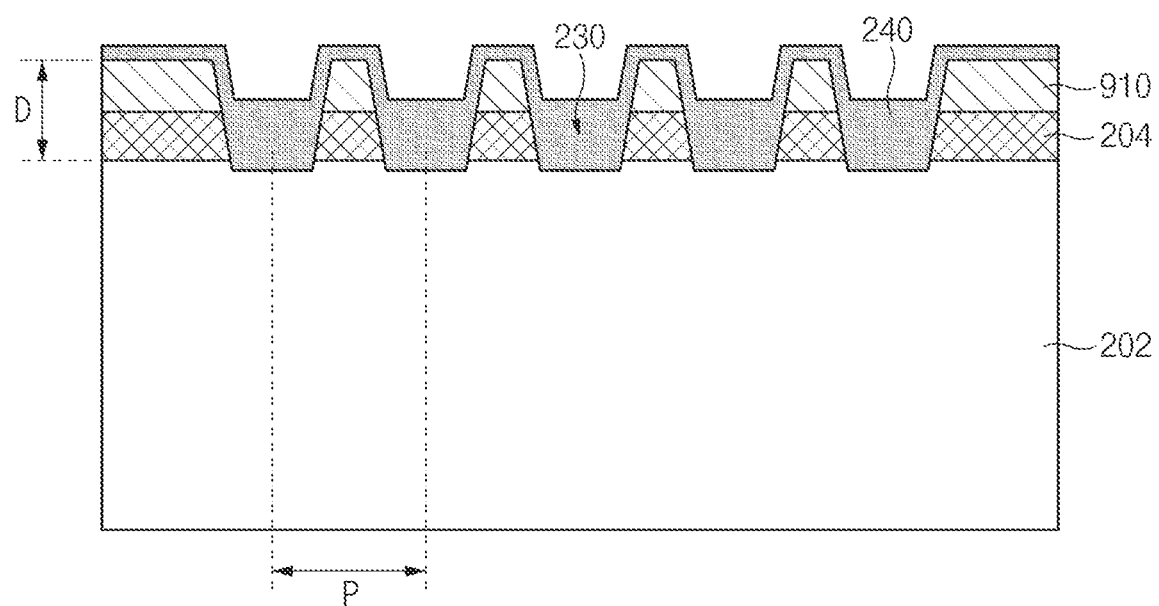
FIG. 10A is a cross-sectional view illustrating a printed circuit board, according to a comparative example.
Figure 10B:
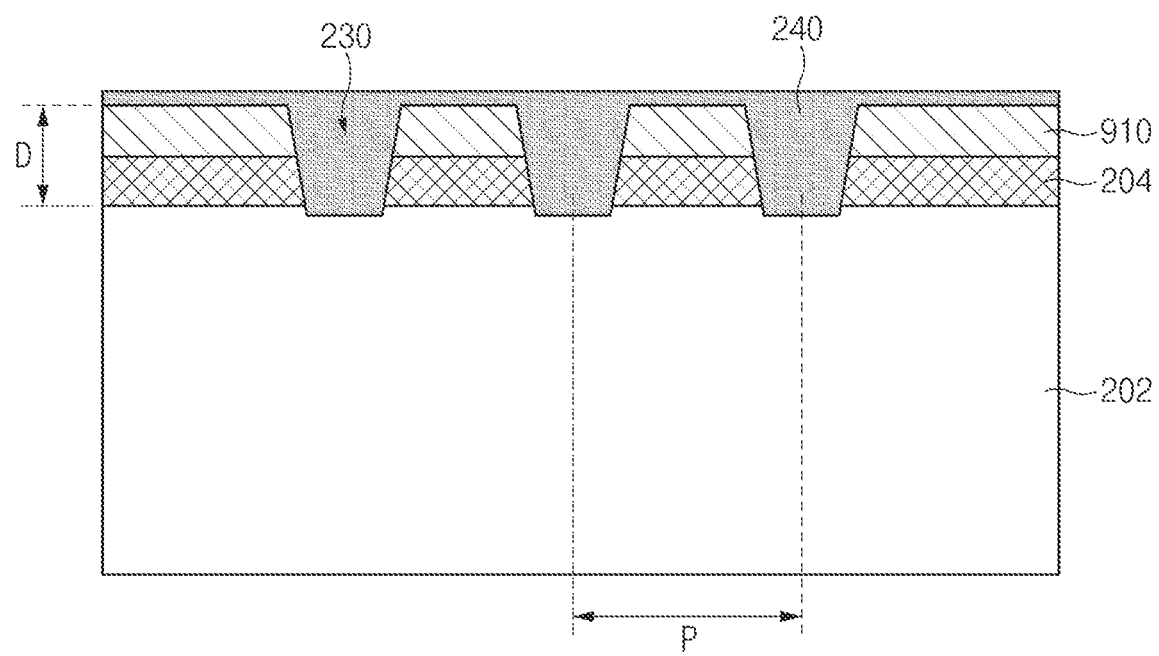
FIG. 10B is a cross-sectional view illustrating a printed circuit board, according to an embodiment.

FIG. 10A is a cross-sectional view illustrating a printed circuit board according to a comparative example, and FIG. 10B is a cross-sectional view illustrating a printed circuit board according to an embodiment.

When the distance 'P' between the via holes 230 is twice less than the depth 'D' of the via holes 230 according to the comparative example illustrated in FIG. 10A, the total number of the via holes 230 overlapped with the solder members 250 of FIGS. 4 and 7 may be increased, so the filling area for the copper plating to form the filling member 240 may be relatively increased. Accordingly, since the filling member 240 is not completely filled in the via hole 230, a dimple phenomenon may occur in which the top surface of the filling member 240 is concavely recessed toward the base member 202. Since the surface part of the filling member 240 becomes irregular due to the dimple phenomenon, a contact defect between the filling member 240 and the solder member may be caused, so reliability may be degraded. Meanwhile, to prevent the dimple phenomenon in the comparative example, when the extent of copper plating is increased, the manufacturing cost may be increased.

To the contrast, when the distance 'P' between the via holes 230 according to the embodiment illustrated in FIG. 10B is greater than the depth 'D' of the via holes 230, the total number of the via holes 230 overlapped with the solder member may be reduced, so the filling area for the copper plating may be relatively reduced. Accordingly, the filling member 240 may be completely filled in the via hole 230 by using a smaller amount of copper plated, as compared to that the comparative example. According to an embodiment, the dimple phenomenon may be prevented, and the manufacturing cost may be increased.

Figure 11:
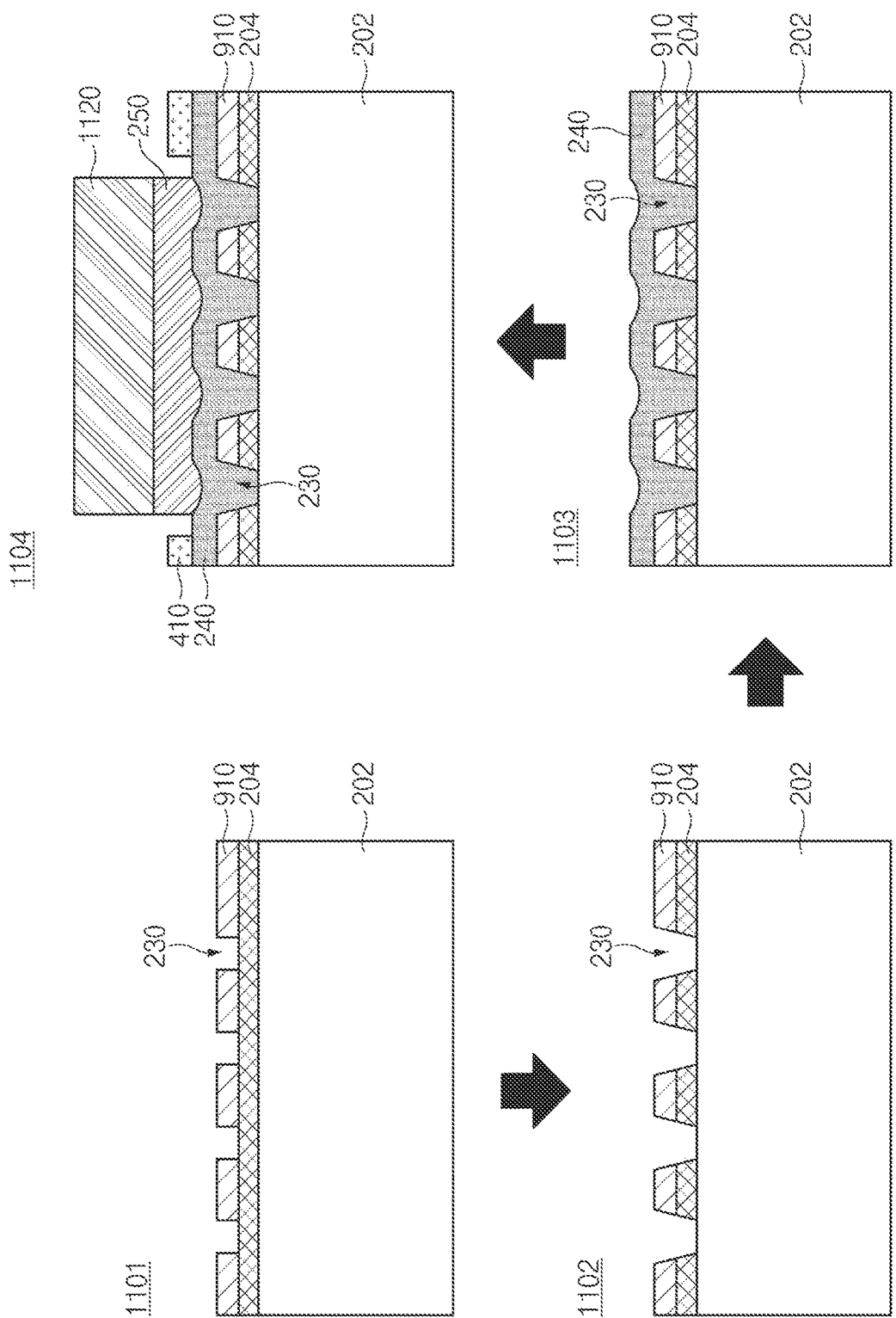
FIG. 11 illustrates a method of manufacturing a light source module including a printed circuit board, according to various embodiments.

FIG. 11 illustrates a method of manufacturing a light source module including a printed circuit board, according to various embodiments.

Referring to FIG. 11, in operation 1101, after the insulating layer 204 is coated on the entire surface of the base member 202, a plurality of conductive pads 910 may be formed on the insulating layer 204. The plurality of conductive pads 910 may be formed, by forming a conductive layer on the entire surface of the insulating layer 204 and then patterning the conductive layer through a photolithography process and an etching process. Any one of the plurality of conductive pads 910 may be the heat dissipation pad 213 illustrated in FIGS. 2 and 4 or the cathode pad 512 illustrated in FIGS. 5 and 6. The conductive pad 910 may be formed to have the plurality of via holes 230.

In operation 1102, the insulating layer 204 exposed through the via hole 230 in the conductive pad 910 is patterned through at least one process among mechanical, laser, and chemical process, such that each of the plurality of via holes 230 may extend through the insulating layer 204. For example, a process using a UV or CO2 laser manner may be to form the via hole 230 in a desired shape by concentrating optical energy on the surface of the insulating layer 204 to melt and evaporate a portion of the insulating layer 204.

In operation 1103, the filling member 240 may be formed on the base member 202 having the plurality of via holes 230. The filling member 240 may be formed by filling copper in the via hole 230 through a copper plating process.

In operation 1104, the protective layer 410 may be formed on the base member 202 on which the filling member 240 is formed. The protective layer 410 may be formed in the remaining region, except for the region for forming the solder member 250. After the solder member 250 is formed on the base member 202 having the protective layer 410, the light emitting diode 1120 may be mounted. The conductive pad 910 may make contact with the light emitting diode 1120 through the solder member 250.

According to various embodiments of the present disclosure, the thickness of the insulating layer (e.g., the insulating layer 104 of FIG. 1 and the insulating layer 204 of FIGS. 4 and 7) may affect heat dissipation characteristics. As shown in Table 1, the thermal conductivity is constant even if the thickness of the insulating layer is changed, but the heat dissipation characteristic may be inversely proportional to the thickness of the insulating layer.

TABLE 1

| Thickness (mm) | Thermal conductivity (W/mk) |
|---|---|
| 1.570 | 0.5 |
| 0.070 | 0.5 |

Accordingly, the insulating layer may be formed to be several tens of times thinner than the base member (e.g., the base member 102 of FIG. 1 and the base member 202 of FIGS. 4 and 7). For example, the insulating layer may be formed to have a thickness of about 20 to 30 times thinner than that of the base member. As the insulating layer is formed to have a smaller thickness (e.g., 0.05 to 0.08 mm), heat dissipation characteristics may be enhanced.

In addition, as the thickness of the insulating layer is relatively small, the depth of the via hole (e.g., the via hole 130 in FIG. 1; the via hole 230 in FIGS. 4 and 7) may be relatively small. Accordingly, the filling member (e.g., the filling member 140 of FIG. 1 and the filling member 240 of FIGS. 4 and 7) may be completely filled in the via hole, so a dimple phenomenon is prevented.

In addition, the insulating layer may be formed to have a thickness smaller than that of the conductive pad and the filling member in contact with the top surface of the conductive pad to maintain the insulating characteristics.

According to various embodiments of the present disclosure, although a light emitting diode (e.g., the light emitting diode 120 of FIG. 1, the light emitting diode 220 of FIG. 4, and the light emitting diode 520 of FIG. 7) is mounted, as an electronic part mounted on a printed circuit board (e.g., the printed circuit board 101, the printed circuit board 201 of FIG. 2, and the printed circuit board 501 of FIG. 5), the resent disclosure is not limited thereto. According to the present disclosure, an electronic part to emit heat may be applied to the printed circuit board as well as a light emitting diode. For example, the electronic part to emit the heat may be applied to a driving chip or other components well known to those skilled in the art. The electronic art emitting heat may be disposed to be overlapped with the via hole.

In addition, according to the present disclosure, the light source module (e.g., the light source module 100 of FIG. 1) including the light emitting diode (e.g., the light emitting diode 120 of FIG. 1, the light emitting diode 220 of FIG. 4, and the light emitting diode 520 of FIG. 7) may be disposed in at least any one of an inner part and an outer part of the vehicle. Light source modules placed outside the vehicle may output light to ensure a visible distance and to allow another vehicle to recognize a host vehicle, at night or when the vehicle enters tunnels and parking lots. For example, the light source module may include a brake lamp, a tail lamp, a backup lamp, or a turn signal lamp for a vehicle. The light source module may have a configuration in which at least two light sources of a brake lamp, a tail lamp, a backup lamp, or a turn signal lamp are connected in parallel or in series. The light source module disposed inside the vehicle may include a manipulation button to manipulate the internal operation of the vehicle and a plurality of LEDs provided in a cluster, and may output light to ensure visibility at night, a tunnel, and a parking lot.

According to various embodiments of the present disclosure, the printed circuit board and the vehicle including the same may emit heat, which is generated from the light emitting diode, through a plurality of via holes, thereby ensuring the heat dissipation effect.

According to an embodiment of the present disclosure, since the printed circuit board and the vehicle including the same may omit the high heat dissipation sheet, material costs may be reduced by about 60% or more, as compared with the high heat dissipation sheet.

According to an embodiment of the present disclosure, the printed circuit board and the vehicle including the same may secure the heat dissipation effect without the high heat dissipation sheet and ensure cost competitiveness.

In addition, various effects directly or indirectly identified through the present document may be provided.

It should be understood by those skilled in the art that various embodiments of the present disclosure and the terminology used in the various embodiments are not limited to a specific embodiment described in the present disclosure, but include various variations, equivalents, and/or alternatives. Like reference numerals are assigned to like components.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A printed circuit board (PCB), on which one or more light emitting diodes (LEDs) are mounted, each LED including a plurality of electrodes, the PCB comprising:
   a base member;
   an insulating layer disposed on the base member;
   a plurality of conductive pads disposed on the insulating layer and electrically connected to the LED;
   a plurality of via holes, each extending through one of the plurality of conductive pads and into the insulating layer; and
   a plurality of filling members respectively disposed at the plurality of via holes and configured to electrically connect the base member to the plurality of conductive pads,
   wherein a distance between two of the plurality of via holes neighboring each other is n times greater than a depth of at least one of the plurality of via holes, wherein n is a positive integer greater than 1 and less than 10.

2. The PCB of claim 1, wherein the distance between the plurality of via holes is twice or triple times greater than the depth of the at least one via hole.

3. The PCB of claim 1, wherein:
   the LED includes an anode electrode and a cathode electrode, and
   the plurality of conductive pads includes (1) an anode pad electrically connected to the anode electrode of the LED and (2) a cathode pad electrically connected to the cathode electrode of the LED.

4. The PCB of claim 3, wherein the plurality of via holes extends through the cathode pad.

5. The PCB of claim 4, wherein the cathode pad is connected to receive a ground signal.

6. The PCB of claim 4, further comprising:
   a power terminal electrically connected to the anode pad;
   a plurality of coupling holes disposed at the base member; and
   a coupling member extending into the coupling holes and configured to couple the PCB to an under-base structure disposed under the base member, wherein a head of the coupling member is spaced apart from the power terminal.

7. The PCB of claim 3, wherein:
the LED further includes a heat dissipation electrode spaced apart from the anode electrode and the cathode electrode, and
the plurality of conductive pads further includes a heat dissipation pad electrically connected to the heat dissipation electrode.

8. The PCB of claim 7, wherein the plurality of via holes extends through the heat dissipation pad.

9. The PCB of claim 1, wherein the base member and the filling member comprises metal of the same series.

10. The PCB of claim 9, wherein:
the base member comprises copper, and
the filling member is plated with copper.

11. The PCB of claim 1, wherein:
the insulating layer is interposed between the base member and the plurality of conductive pads, and
the insulating layer has a thickness smaller than that of the base member.

12. A vehicle comprising the PCB and the one or more LEDs of claim 1.

13. The vehicle of claim 12, wherein the distance between the two neighboring via holes is twice or triple times greater than the depth of the at least one via hole.

14. The vehicle of claim 12, wherein:
the LED includes an anode electrode and a cathode electrode, and
the plurality of conductive pads includes (1) an anode pad electrically connected to the anode electrode of the LED and (2) a cathode pad electrically connected to the cathode electrode of the LED.

15. The vehicle of claim 14, wherein:
the cathode pad is configured to receive a ground signal, and
the plurality of via holes extends through the cathode pad.

16. The vehicle of claim 14, further comprising:
a power terminal electrically connected to the anode pad;
a plurality of coupling holes disposed at the base member; and
a coupling member extending into the coupling holes and configured to couple the PCB to an under-base structure disposed under the base member,
wherein a head of the coupling member is spaced apart from the power terminal.

17. The vehicle of claim 14, wherein:
the LED further includes a heat dissipation electrode spaced apart from the anode electrode and the cathode electrode,
the plurality of conductive pads further includes a heat dissipation pad electrically connected to the heat dissipation electrode, and
the plurality of via holes extends through the heat dissipation pad.

18. The vehicle of claim 12, wherein the base member and the filling member comprises metal of the same series.

* * * * *